(12) United States Patent
Chen

(10) Patent No.: US 7,014,960 B2
(45) Date of Patent: Mar. 21, 2006

(54) CHELATION CLEANING PROCESS FOR REPAIRING PHOTOMASKS

(75) Inventor: Same-Ting Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 172 days.

(21) Appl. No.: 10/635,982

(22) Filed: Aug. 7, 2003

(65) Prior Publication Data

US 2005/0031965 A1 Feb. 10, 2005

(51) Int. Cl.
*G03F 9/00* (2006.01)

(52) U.S. Cl. .......................................................... 430/5
(58) Field of Classification Search ..................... 430/5
See application file for complete search history.

(56) References Cited

U.S. PATENT DOCUMENTS 5,965,301 A   10/1999   Nara et al.

*Primary Examiner*—Christopher G. Young
(74) *Attorney, Agent, or Firm*—Duane Morris LLP

(57) ABSTRACT

The present invention relates to a method for repairing a photomask by removing a residual defect in the photomask, the method including removing the defect area by gallium chelation with a water-soluble amine polymer.

7 Claims, No Drawings

CHELATION CLEANING PROCESS FOR REPAIRING PHOTOMASKS

BACKGROUND OF THE INVENTION

1. Field of the Invention

The present invention relates to a method for repairing a photomask by gallium chelation, and particularly to a method for repairing a phase shift photomask by gallium chelation with water-soluble polymers.

2. Background Art

Repairing mask defects with a focused ion beam (FIB) of gallium often results in a gallium-implanted area due to scan. This implanted layer reduces the light transmission by up to about 40 percent, depending on the wavelength. The effect of localized transmission loss becomes printable at the extremes of the focus-energy matrix of wafer printing. The existing methods for gallium removal give rise to quartz damage, side-etching or critical dimension (CD) variation.

Focused ion beam tools are typically used for binary and MoSiON phase shifting mask (PSM) defect repair. FIB tools use a finely focused beam of gallium ions that can be operated at low beam currents for imaging, or high beam currents for site-specific sputtering of chrome and other materials. However, the gallium-induced imaging and milling processes have the side effect of gallium being implanted on quartz. The gallium-implanted area absorbs light of 248 nm and 193 nm, giving rise to a localized transmission loss, printable defects on a wafer at the process split corners. A current gallium removal method employs plasma or corrosive chemicals for full-field quartz etching on masks. This method has some disadvantages, such as quartz damage, side-etching, and large critical dimension (CD) variation between the imaging and the non-imaging area after post-treatment. Moreover, this corrosive base is not suitable for sensitive materials like MoSiON PSM, because it damages the PSM shifter and results in phase angle and transmittance loss.

The repair of photomasks by sputter removal of chrome and other materials with a focused ion beam of gallium results in an attenuated layer of gallium implanted on the scanning or sputtering area. As noted above, this implanted area reduces the light transmission through it by up to about 40 percent, depending on the wavelength of the illumination. The effect of localized transmission loss will "print out" on the process wafer after exposure and produce CD variation. Further to the above discussion, current methods employ gas assisted etching (GAE) or direct sputtering on the quartz area, but are confined to the repaired area, and not all of the scanning image area. The ion plasma and corrosive chemical treatments are used for full-field etching on the photomask for removing gallium stains. These methods have disadvantages, e.g., quartz damage, side-etching, and larger CD variation between imaging.

Focused ion beam machines are typically used to carry out mask repair for Cr binary and phase shift masks. As is known, the gallium-induced imaging process results in gallium stains on the quartz area. At present, strong basic chemicals are used to remove such stains. However, this corrosive method impacts CD variation and induces side-etching, resulting in e.g., peeling.

The present invention relates to a gallium-removing process using a water-soluble polymer containing polyligands as a "catcher" for the metal chelation process. The present invention further relates to an improved gallium-removing cleaning process. This process is based on the concept of gallium chelation, with designed water-soluble polymers attached to multiple ligands for chelation.

SUMMARY OF THE INVENTION

The present invention relates to a method for repairing a photomask by removing a residual defect in the photomask, the method comprising removing the gallium-implanted defect area by gallium chelation with a water-soluble amine polymer containing carboxyl, hydroxyl and amine groups. It is a non-corrosive and environmentally friendly procedure.

DETAILED DESCRIPTION OF THE INVENTION

The method of the present invention uses a water soluble amine polymer equipped with a ligand as a "catcher" for metal chelation. The mechanism is similar to that for ethylenediaminetetracetic acid (EDTA) in metal chelation. In the method of the present invention, after dipping of the FIB-scanned photomask, 248 nm and 193 nm microlithography simulation microscope (MSM) illuminations were used to detect changes in intensity. The water-soluble amine polymer may be expressed generally as follows: $C_xH_{2x}O_nN_m$. A preferred amine polymer has a weight average molecular weight of about 23,000 (herein Polymer A; in water, 0.5%–50%). For the 248 nm illumination, before treatment with Polymer A, the intensities of the scanned area and non-scanned area were 0.92 and 0.98, (measured as intensity of scanned quartz area/intensity of normal quartz area (units of intensity as $mW/cm^2$)) respectively. After the Polymer A treatment (by dipping in solution), the intensity of the scanned area increased from 0.97 to 0.98. A pH of the system to be treated is from about 1–6, with a pH of about 4 preferred.

Relative to the 193 illumination, before Polymer A treatment, the intensities of the scanned area and non-scanned area were 0.88 and 0.97, respectively. After Polymer A treatment as noted above, the intensity of the scanned area increased from 0.97 to 0.98. This restoration in intensity maintains the patterns of the scanned area and prevents defects, due to gallium implantation, printed in wafers at the process split corners.

In further testing of the present invention, the masks were scanned and GAE repaired with FIB tools—Seiko 3000 and Micrion 800. These masks were treated with Polymer A as noted above at 70° C. for 20 minutes, and then cleaned with deionized (DI) water. After dipping of FIB-scanned photomasks, 248 nm and 193 nm illumination MSM100, ZEISS (Microlithography Simulation Microscope) and AIMS (Aerial Image Measurement System) were used to measure the intensity and CD variations. PSM phase angle and transmittance were then measured.

Although the FIB imaging mechanism is a small dosage scanning tool, and no etching gas was used to etch the scanned quartz area, some gallium was implanted on the quartz area. The intensity of the scanned area and non-scanned area was 0.92 and 0.98, respectively. After treatment with Polymer A as described above, the intensity of the scanned area and non-scanned area were nearly equal, both increasing to 0.97–0.98. Intensity was improved by about 1.5–2.7% $mW/cm^2$.

The intensity difference between the scanned and non-scanned areas was also improved from 20% to approximately 0% after Polymer A treatment. Micrion 800 was used to etch open three holes by bromine etching and gallium scanning. The holes on the scanned area were of low intensity and small CD—0.155 μm vs. 0.180 μm (ref.). After treatment with Polymer A, the intensity of scanned holes recovered (from 0.155 μm to 0.183 μm) and the CD of the repaired hole increased from 0.146 μm to 0.176 μm, due to removing gallium stains.

In order to verify the gallium-removal capability of the amine polymer of the present invention for PSM, Micrion 800 (24PA, 5 μm field) was used to image 10 times on specific holes of PSM, which were then treated with Polymer A. The intensity and CD of the scanned holes were enhanced 4% and 1% at 248 nm illuminations, and 5% and 1% at 193 nm illuminations.

Note that the defect referred to above is causative of a partial deterioration in light transmittance of the photomask in its gallium-implanted defect area and an area around the residual defect area to recover the light transmittance of said areas in the photomask. Note also that in the repair of the photomask, assist gas enhances the etching simultaneously with the focused ion beam irradiation.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

What is claimed is:

1. A method for repairing a photomask by removing a residual defect in the photomask, the method comprising removing the defect area by gallium chelation with a water-soluble amine polymer containing carboxyl, hydroxyl and amine groups.

2. The method as recited in claim 1, wherein said defect is causative of a partial deterioration in light transmittance of the photomask in its gallium-implanted defect area and an area around the gallium-implanted defect area to restore the light transmittance of said areas in the photomask.

3. The method as recited in claim 1, wherein, in the repair of the photomask, assist gas enhances the etching simultaneously with the focused ion beam irradiation.

4. The method as recited in claim 1, wherein the photomask is a phase shift photomask.

5. The method as recited in claim 1, wherein the pH of the defect area to be treated is about 1–6.

6. The method as recited in claim 5, wherein the pH of the defect area to be treated is about 4.

7. The method as recited in claim 1, wherein the molecular weight of the water-soluble amine polymer is about 23,000.

* * * * *